METHOD FOR THE PREPARATION OF COPPER SULFIDE FILMS AND PRODUCTS OBTAINED THEREBY

Filed Aug. 29, 1961

Inventors
Joseph Gaynor
James F. Burgess
Bernard C. Wagner
by Paul A. Frank
Their Attorney 3,203,836

METHOD FOR THE PREPARATION OF COPPER SULFIDE FILMS AND PRODUCTS OBTAINED THEREBY

Joseph Gaynor and James F. Burgess, Schenectady, and Bernard C. Wagner, Troy, N.Y., assignors to General Electric Company, a corporation of New York Filed Aug. 29, 1961, Ser. No. 134,700
10 Claims. (Cl. 148—6.31)

This invention pertains to an improved method for the preparation of a copper sulfide film by the direct reaction of a copper film with a gaseous medium. More particularly, the invention pertains to the preparation of a copper sulfide film by the direct conversion of at least a portion of a reactive copper film with a sulfur containing gas in such a manner as to yield a transparent electrically conducting product.

Transparent and electrically conducting copper sulfide films have been prepared by reacting thin metal sulfide films with liquid solutions containing copper ions. For example, in the prior invention of D. A. Cusano et al. described and claimed in copending application, Serial No. 22,247, filed Apirl 14, 1960, now Patent No. 3,095,324, issued June 25, 1963, entitled, "Electrically Conducting Films," and assigned to the assignee of the present invention, a zinc sulfide coating is deposited on a dielectric substrate and the product immersed in a solution of copper ions, e.g., copper acetate, copper sulfate, etc., wherein the copper ion replaces the cation in the sulfide to produce an electrically conducting transporent and tightly adherent coating. Whereas a coating prepared in this manner has many useful applications, its method of preparation involves the use of solvents with consequent need for their removal from the final product. The use of water as a solvent in the mentioned method eliminates the dangers of inflammability and toxicity associated with the common organic solvents but removal of any liquid solvent is an additional operation requiring expenditures of equipment, time, and generally heat energy. Additionally, many polymeric materials are soluble or sensitive to solvents generally so that a solvent method of film preparation on such substrates cannot be suitably employed. The applicants have discovered a simplified method not employing solvents for the preparation of copper sulfide films having all the desirable characteristics of the Cusano products.

It is one object of the invention, therefore, to provide a simplified method for the preparation of transparent, electrically conducting copper sulfide films.

It is another object of the invention to prepare supported copper sulfide films in situ such that the products have improved physical and electrical properties.

It is still another object of the invention to provide a method for controlling the transparency and electrical conductivity of the copper sulfide films during preparation.

Yet still another object of the invention is to provide a continuous method for the preparation of transparent electrically conducting copper sulfide films in situ on thin flexible polymeric media.

These and other objects of the invention will be more apparent from the following description of the invention taken in connection with the accompanying drawings.

Briefly, the method of the invention comprises reacting a thin film of a reactive copper compound which has been deposited on a substrate with a sulfur containing gas. By "reactive copper compound" as appearing hereinafter in the specification and claims, is meant a film-forming copper compound, such as copper, copper iodide, copper acetate, copper chelates, etc., which may be directly converted to copper sulfide by contact with the sulfur containing gas. The physical properties of the final coating can be controlled during the conversion process so that films having optical transmissions in the visible spectrum from about 50–98% and resistances between about 26 ohms per square to 10,000 ohms per square are obtained by practice of the invention. The wide range in optical and electrical characteristics of these surface films makes them especially suitable as the conducting layer for the type information recording medium described in the copending application of William E. Glenn, Jr., Serial No. 698,167, now abandoned, filed November 22, 1957, entitled, "Method and Apparatus for Electronic Recording," and assigned to the assignee of the present invention.

The combination of physical properties for the converted films of the invention is not found in other electrically conducting copper sulfide films. In the copending application of the applicants entitled, "Method for the Preparation of Copper Sulfide Films and Products Obtained Thereby," Serial No. 134,701, and filed August 29, 1961, copper sulfide films are prepared directly on flexible polymeric substrates by converting a deposited layer of a zinc sulfide-type compound with dissolved copper ions. The conducting films produced by this method are characterized by excellent optical transmission throughout the visible spectrum and resistance to cracking or crazing with mechanical flexure of the composite medium. While all of the converted films of the present invention have these characteristics, said films also possess an unexpected combination of electrical conductivity and optical transmission not exhibited by the other films. More particularly, experience with the present films has indicated a general ability to improve the electrical conductivity of the film by increasing the concentration of sulfur in the converted composition to a significant stoichiometric excess. Since control of the film conductivity in this manner is relatively independent of film thickness which governs optical transmission of the film to an important degree, it is possible to achieve certain combinations of conductivity and transmission within the wide range above disclosed which are not found in other converted copper sulfide films. Certain other converted films of the invention having a residual unconverted metallic copper layer provide still further advantages. The underlying metallic copper portion of the film is an excellent heat conductor so that any heat transmission through the composite layer will be facilitated. Additionally, in applications where the partially converted film serves as an electrical ground plane such as described in the previously mentioned Glenn invention, the intimately associated copper film provides improved ground means.

In one embodiment of the invention, a layer of the reactive copper compound is continuously deposited upon the surface of a thin flexible polymeric tape being unwound from a supply roll and the deposited layer is converted to the conducting transparent copper sulfide film after the tape has been rewound on an ordinary spool. In another embodiment of the invention, the deposition of the reactive copper compound layer and subsequent conversion of at least a portion of the layer to copper sulfide are accomplished continuously. For the latter embodiment, both the optical transmission and electrical resistance of the film may be measured during the process so that adjustments can be made in the preparation to conform to a desired transparency or resistance within the wide range of values above stated. Minimum optical transmission of the converted film in the embodiment is controlled by the visible transmission of the deposited reactive copper compound since it has been found for the preferred compositions that the transmission of the converted film is greater than the transmission of the reactive copper compound film. The final electrical conductivity of the converted copper sulfide film can be controlled during the conversion process through resistance measurements made while the reactive copper compound film is being continuously converted to copper sulfide film. The particular manner in which the invention is carried out for both continuous and non-continuous preparation is illustrated in greater detail for the following preferred embodiments in which:

Figures 3, 4:
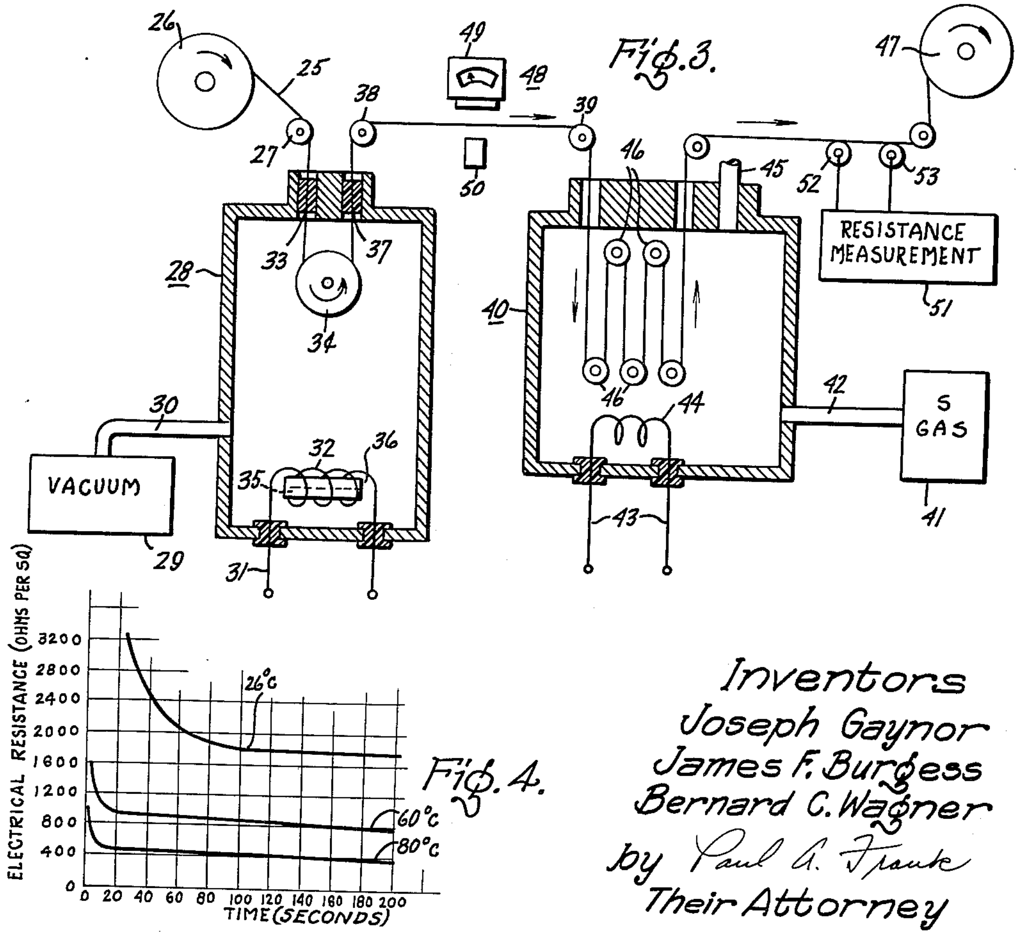

FIGURE 3 is still another schematic representation illustrating one method for continuously depositing a film of a reactive copper compound on the surface of a flexible tape and converting the deposited film to copper sulfide including means for both measuring the optical transparency of the deposited reactive copper compound film and measuring the electrical resistance of the converted copper sulfide film;

FIGURE 4 is a plot illustrating the change in electrical resistance of a copper film being converted to copper sulfide according to the invention.

Figure 1:
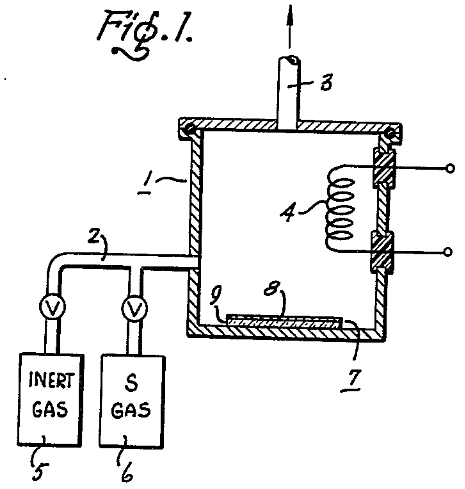
FIGURE 1 illustrates a simple apparatus for converting a supported film of a reactive copper compound to copper sulfide.

In FIGURE 1 there is shown a reaction chamber 1 having inlet means 2 and exhaust means 3 for the sulfur containing gas as well as an ordinary heating source 4 shown simply in the drawing as a resistance coil. A closed metal container having a removable cover, such as shown, provides a suitable reaction chamber for converting the deposited reactive copper compound film to copper sulfide since the conversion temperatures are relatively low. Entrance means 2 for conducting the sulfur containing gas to the reaction chamber comprises a manifold suitably valved to both a source of inert gas 5 and a source of the sulfur containing gas 6. While satisfactory conversion can be achieved under ordinary atmospheric conditions, the conversion process is preferably conducted in atmospheres (inert gas, vacuum, etc.) which can be purged for closer control of the process. Traces of moisture normally associated with all gaseous atmospheres have a catalytic effect upon the conversion. The sample 7 to be treated in the present embodiment consists simply of a reactive copper compound film 8 deposited on the surface of a dielectric, such as a flat plate or disk 9.

A film of vapor deposited copper having a thickness of approximately 20 angstroms and a light transmission at 3,500 angstroms wavelength of approximately 79.5% is deposited on an ordinary glass microscope slide by ordinary vapor deposition techniques. The coated slide is placed in the reaction chamber and the chamber filled with nitrogen while heating the slide up to a temperature of approximately 100° C. After the sample has been heated to the desired temperature, the nitrogen atmosphere is discontinued and a slow stream of hydrogen sulfide at ordinary temperatures is admitted to the reaction chamber for a period of approximately 1–2 minutes. At the end of the reaction period, the treated slide is removed from the reaction chamber and various test measurements are made to determine the optical transmission and electrical conductivity of the converted film.

The physical characteristics of a typical converted film made under the above conditions includes an optical transmission of 85% at 5,500 angstroms and electrical resistance of around 200 ohms per square. Optical transmission measurements can be made routinely with a recording photometer utilizing a light source filter to a peak at the 5,500 angstroms wavelength. Resistance measurements can also be made in a conventional manner with a vacuum tube voltmeter.

Figure 2:
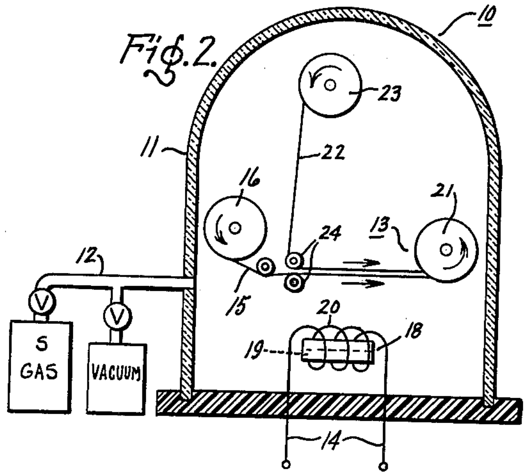
FIGURE 2 is a schematic representation of an apparatus for depositing a reactive copper compound film continuously on the surface of a flexible material and thereafter converting the deposited film to copper sulfide.

FIGURE 2 illustrates an apparatus 10 for conducting both the deposition of a reactive copper compound film on a continuous polymeric tape substrate and for subsequent conversion of the deposited film to copper sulfide. The apparatus 10 consists conveniently of a bell jar type reaction chamber 11 having inlet means 12 for vacuum and the sulfur containing gas, transport means 13 for winding and unwinding the tape in the chamber, and heating means 14 for conducting the vapor deposition of the reactive copper compound and conversion of the deposited compound to copper sulfide. The deposition of a transparent copper film on a polymeric tape 15 is accomplished simply by passing the tape through copper vapors emanating from a heated mass of molten copper in vacuum. Thus, polymer tape 15 is unwound from supply reel 16 and directed over the top of an alumina crucible 18 containing a molten mass of copper 19 which has been heated to the molten state by resistor element 20. The alumina crucible 18 is coated on the inside walls with titanium hydride to improve the wetting characteristics of molten copper thereby providing a more uniform vaporization process. The vaporized copper deposits as a smooth continuous film on the underside surface of the polymer tape as the tape is unrolled from supply reel 16 and transporated to wind-up reel 21 in a continuous manner. Before the coated tape is re-rolled on wind-up reel 21, a layer of ordinary kraft paper 22 supplied from spool 23 is inserted between successive layers of the tape by means of feeding both tape 21 and paper layer 22 through the nip between two rollers 24 located in parallel relationship. The drive mechanism for the tape transport system has been omitted in FIGURE 2 for simplicity and clarity of illustration and any known drive means is believed suitable with the transport system. After coating the polymer tape with a transparent copper film and rewinding the tape on reel 21, the crucible is removed and the temperature of the reaction chamber is reduced by means of decreasing power to resistor coil 20. Sufficient power is provided to the coil to maintain reaction chamber temperatures in the range 100–125° C. for more rapid conversion. After the coated tape has been heated to the reaction chamber temperatures, the vacuum is discontinued and a slow stream of the sulfur containing gas is admitted to the reaction chamber for periods ranging from 5–10 minutes to complete the conversion of the film to copper sulfide. The intermediate kraft paper layers in the rewound tape film facilitate penetration of the reactant gas but are not absolutely essential for a successful conversion. Any non-reactive gas absorbent material is believed utilizable for this purpose.

To illustrate the preparation of a polymeric tape containing a copper sulfide film prepared according to the above embodiment, a 25 foot roll of photographic grade polyester film having a thickness of approximately 100 microns is first coated with a thin transparent copper film. The tape is constructed of a polyethylene terephthalate material containing small intercondensed residues from dihydric alcohols such as propylene glycol-1,3 and is sold by the E. I. du Pont de Nemours and Company, Inc. under the trademark "Cronar." The deposition of the copper film on the tape is accomplished at vacuums in the range $10^{-4}$–$10^{-6}$ millimeters of mercury pressure and at tape speeds of about 150 feet per minute. Out-gassing of the tape by means of exposing the tape to vacuum before vapor deposition improves adherence of the copper film to the polymeric substrate. A typical tape coated with an approximately 15 angstroms thick copper film in the above manner has a light transmission of approximately 84% at 5,500 angstroms. When the copper film is converted to copper sulfide by exposing the rolled tape having a kraft paper intermediate layer to hydrogen sulfide for about 5 minutes at 100° C., the resultant film has an optical transmission of about 97% at 5,500 angstroms wavelength and a resistivity of approximately 540 ohms per square.

FIGURE 3 illustrates one embodiment for continuously coating a polymeric tape with a reactive copper compound film and subsequently converting the deposited film to copper sulfide having means for controlling both the amount of reactive copper compound deposited and the degree of conversion. One advantage for the continuous preparation of films in this manner is the ability to adjust operating conditions during the process to achieve the desired film characteristics which promotes operational efficiency and minimizes risk of rejection. The embodiment also illustrates the relative rapidity of the conversion process for the conducting films of the invention. All components in the apparatus of the embodiment are shown in block diagram form as in previous drawings since the individual components are well known, available, and not critical to the successful practice of the invention. The deposition of the reactive copper compound film is accomplished on the polymeric tape according to the same general method described for FIGURE 2. The deposition of the reactive copper compound film is performed in a first reaction chamber whereas conversion of the reactive copper compound to copper sulfide takes place in a second reaction chamber for the purpose of permitting continuous deposition and conversion during the process. Since the conversion reaction generally is a slower process than deposition of the reactive copper compound, longer residence time in the second reaction chamber is provided. This is achieved as shown simply by establishing a relatively longer path length for the tape in the second reaction chamber. An alternate arrangement for conversion of the reactive copper compound in the continuous fashion of the embodiment is to employ the method described for FIGURE 2. Thus, tape having the reactive copper compound layer can be rewound in the second reaction chamber and converted with electrical resistance measurements being made to control the degree of conversion.

In FIGURE 3, polymeric tape 25 is supplied from a spool 26 to a guide roll 27 for entry into first reaction chamber 28. Reaction chamber 28 is equipped with a source of vacuum 29 (not shown) connected to the chamber through conduit means 30 and a source of heat 31 which can be a simple electrical resistance coil 32 connected to a power supply. Air leakage to the vacuum chamber is minimized by means of elastomeric seals at the openings for the tape. The polymeric tape enters the reaction chamber through slotted opening 33 and passes around the circumference of roller 34. While in the reaction chamber, the tape is exposed to the vapors of a reactive copper compound 35 being volatilized from crucible 36. Crucible 36 is supported in the turns of resistance coil 32 for maximum heating efficiency in volatilizing the reactive copper compound. In this manner, a Cronar tape may be given a suitable layer of copper at tape speeds up to and exceeding 180 feet per minute. The coated tape emerges from the reaction chamber via slotted opening 37 and is conducted over guide rolls 38 and 39 into second reaction chamber 40. Reaction chamber 40 is equipped with a source of a sulfur containing gas 41 (not shown) connected to the chamber through conduit means 42, a source of heat 43 in the form of a resistance coil 44 connected to a power supply and exhaust means 45 for removal of gaseous reaction products. In chamber 40, the coated tape is passed around the circumference of rollers 46 in a heated atmosphere of the sulfur containing gas whereupon the layer of the reactive copper compound is converted to copper sulfide. The converted tape is removed from the reaction chamber and rewound on spool 47 for storage.

Optical transmission measurements are made on the coated polymeric tape by means of an ordinary photometric device 48 during the process after deposition of the reactive copper compound film. A suitable photometric device comprises simply a photometer 49 and a light source 50. Measurement of optical transmission during deposition permits adjustment of the amount of copper compound thereafter deposited by such means as altering the crucible temperature, vacuum, or tape speed, to conform to any desired degree of optical transmission within the wide range previously mentioned. Since the optical transmission of the converted copper sulfide film is generally higher than the transmission of the reactive copper compound film, it is possible by this means to control the minimum optical transmission of the final converted film. Resistance measurements on the converted film are made with any suitable device for the measurement of electrical resistance, such as an electrometer or vacuum tube voltmeter simply by contacting the film with probes from the instrument. In FIGURE 3, the instrument 51 is connected to the tape through metal rollers 52 and 53 contacting the surface of the converted film. A conducting film produced by continuously vapor depositing an approximately 20 angstroms thick copper layer on the polymeric tape having a 0.004 inch thickness and thereafter exposing the deposited layer to a hydrogen sulfide atmosphere for 1 minute at 80° C. has an electrical resistance of 320 ohms per square and a visible light transmission of 90%.

The results in Table 1 below indicate typical optical transmission and electrical resistance value for various copper films on Cronar tape converted according to the invention.

*Table 1*

| Film Thickness (angstroms) | Optical Transmission, percent at 5,500 angstroms wavelength | Electrical Resistance (ohms per square) |
|---|---|---|
| 4 | 98 | 8100 |
| 100 | 89 | 200 |
| 300 | 76 | |
| 600 | 62 | |
| 980 | 52 | 26 |

From the above results, it will be apparent that a wide range in both the optical transmission and electrical resistance of the conducting films can be obtained. The final optical transmission of a converted film depends both upon film thickness and degree of conversion. Film thickness controls maximum optical transmission to the extent that the thick films in the above range exhibit a small amount of light absorption in certain portions of the visible spectrum. Conversion of a copper film results in increased optical transmission so that the minimum optical transmission of the copper sulfide film is always greater than the optical transmission of the unconverted film. For the converted copper films it can be seen that optical transmission decreases with the film thickness in an approximately regular manner. Whereas it also appears from the above results that electrical resistance is a regular function of film thickness, the resistance of a converted film is primarily a function of degree of conversion, including concentration of excess sulfur in the composition. FIGURE 4 illustrates in detail the rapid decrease in the resistance of a copper film with increasing conversion to copper sulfide as well as points out the relatively fast conversion rates achieved with the method of the invention. In FIGURE 4 there is plotted the change in electrical resistance of various copper films with increasing contact time to hydrogen sulfide at the indicated temperatures. The results indicate substantially complete reaction of the films after only short periods of exposure. The amount of excess sulfur present in typical converted films of the invention is indicated in Table 2 below. The data in Table 2 lists the original thickness of various copper films, the final thickness of the corresponding copper sulfide films and the molar ratio of copper to sulfur in said copper sulfide films. From these results, it is apparent that the stoichiometric excess of sulfur in the converted films does not depend upon film thickness and can be varied between about 0.7 to about 1.4. The term "stoichiometric excess of sulfur" is intended to define a composition of the so-converted films wherein the copper-to-sulfur molar ratio deviates from the stoichiometric composition of cuprous sulfide as shown in the following Table 2. By control of excess sulfur in the converted film, it is possible to vary the electrical resistance independently of optical transmission. While this does not mean any combination of resistance and optical transmission within the wide range above stated can be obtained, it does permit greater selectivity in these properties than can otherwise be obtained.

*Table* 2

| Copper Film Thickness (angstroms) | Converted Film Thickness (angstroms) | Copper Sulfur Molar Ratio |
|---|---|---|
| 246 | 978 | 0.74 |
| 189 | 657 | 0.89 |
| 161 | 601 | 0.81 |
| 116 | 390 | 0.94 |
| 100 | 364 | 0.84 |
| 88 | 293 | 0.95 |
| 66 | 213 | 1.00 |
| 61 | 237 | 0.76 |
| 42 | 149 | 0.71 |
| 37 | 95 | 1.40 |
| 20 | 69 | 0.92 |
| 12 | 51 | 0.70 |

The flexible transparent electrically conducting films of the invention are generally characterized by uniform dimensions and properties, substantial freedom from blemishes and pinholes, and excellent adherence to the substrate even under relatively great mechanical and thermal stress. The present films are especially characterized by stability to mechanical stress whereby the films resist crazing or cracking from extreme or repeated flexure of the substrate. The stability of these films is also attributable to substantial freedom from thermal stress caused by differences in thermal expansion between the surface layer materials and the substrate during deposition of the reactive copper compound or subsequent conversion. Certain of the conversion products resulting from partial conversion of a metallic copper film are further characterized by excellent electrical and thermal conductivity of the residual copper layer. The minimum thickness of a converted film for continuity and freedom from pinholes is about 10 angstroms. Converted films having a thickness greater than about 1000 angstroms are subject to cracking from residual thermal stress or with flexure of the film.

The converted portion of the reactive copper compound layer comprises at least the major portion of the original film thickness. The physical configuration of a converted film includes, therefore, a surface layer of the copper sulfide material and a residual under layer of the originally deposited reactive copper compound. For the minimum film thickness of the invention, substantially all of the reactive copper compound will have been converted to copper sulfide. Conversion of the entire layer for thicknesses approaching the maximum above mentioned, is not as readily accomplished as it requires diffusion of the sulfur containing gas completely throughout the layer coupled with rate is diffusion controlled. One physical result of conversion is an increase of the layer thickness. The chemical reaction mechanism of conversion depends upon the composition of the reactive copper compound so that the reaction can comprise direct reaction of metallic copper film with the sulfur containing gas or displacement of an anion by the sulfide radical if the film is a copper compound. Whereas the mechanism of product formation in the conversion process is understandably diverse, the reaction products can all be characterized as primarily monovalent copper sulfide having a structural formula of $Cu_2S$ and $Cu_9S_5$. The presence of divalent copper ions in the conversion product is satisfactory so long as in minor proportion because of the relatively poor electrical conductivity of cupric sulfide. Converted films contain substantial stoichiometric excess of sulfur in the composition, preferably in the molar ratios 0.7–1.4 moles of copper to one mole of sulfur. The stoichiometric excess of sulfur in the film is generally desirable for increased electrical conductivity.

The reactive copper compounds for conversion to the desired copper sulfide films include elemental copper and those copper compounds which can be deposited on a substrate as microcrystalline deposits in substantial continuous film form. The particle size of the deposited microcrystalline copper compound should not exceed about 150 angstroms so that any light transmitted through the medium will not be diffracted appreciably in the event of incomplete conversion. Suitable reactive copper compounds include copper iodide, the copper chelate of ethylenediamine tetraacetic acid, copper acetate, copper sulfate, copper chloride, copper bromide, and copper nitrate. Deposition of the reactive copper compound can be accomplished by vacuum deposition where a completely dry process for obtaining the copper sulfide film is desired although deposition of the reactive copper compound from a liquid suspension by well-known means provides satisfactory films. Electro-deposits of the reactive copper compound and even deposits of the compound in a polymer matrix can be converted to copper sulfide wherever the character of the substrate and such methods prove especially advantageous. Furthermore, if the substrate on which the reactive copper compound is deposited can be heated to elevated temperatures in the range 500–700° C., typical substrate materials being vitreous silica and any of the high silica content glasses sold by the Corning Glass Works under the trademark "Vycor," satisfactory films may be obtained simply by depositing a powdered stream of the reactive copper compound in suitable thicknesses on the substrate heated to these temperatures. Deposition of a reactive copper compound on ordinary polymeric substrate is generally accomplished by the vapor deposition method hereinbefore described rather than by heating the substrate so that satisfactory films are obtained at ambient temperatures below the softening temperature of the polymer. In illustration, the maximum temperature to which the commercial polyethylene terephthalate films previously disclosed can be heated before deformation is approximately 150° C. Other optically clear polymeric substrates suitable for the deposition of a copper sulfide film according to the invention include polyvinylfluoride, polyvinylidene chloride, polyesters, and polycarbonates.

The sulfur containing gas which may be employed to convert the reactive copper compound film to copper sulfide is characterized broadly as volatile sulfur compound existing in vapor form at the conversion temperatures and which produces sulfide ion ($S^{-2}$) by reaction with the copper compound. The useful sulfur compounds are further characterized by the absence of the oxygen atom in the chemical structure which hinders formation of the sulfide ion during the conversion process. Useful sulfur compounds include reaction products of sulfur with hydrogen such as hydrogen sulfide, hydrogen persulfide, and hydrogen polysulfide; reaction products of sulfur with carbon such as methyl mercaptan and dimethyl sulfide; and reaction products of sulfur with nitrogen, such as thiocyanic acid. Precursor materials can also be employed to supply a suitable sulfur containing gas at the conversion temperatures as for example, metal sulfides which when dissolved in water evolve hydrogen sulfide. Still another class of precursor materials which generate the sulfur containing gas are sulfur compounds such as ammonium sulfide which when heated decompose to liberate hydrogen sulfide.

From the foregoing description, it will be apparent that a broad method has been disclosed for obtaining optically transparent electrically conducting copper sulfide films in situ by converting a thin film of a reactive copper compound deposited on a substrate with a sulfur containing gas. In addition, novel conversion products having improved stability and physical properties have been shown which are especially useful in combination with flexible substrates. Certain partially converted products possess still further advantages for particular applications by reason of properties in the unconverted portion of the film such as excellent heat conduction. It is not intended to limit the invention to the preferred embodiments above shown, since it will be obvious to those skilled in the art that certain modifications of the present teachings can be made without departing from the true spirit and scope of the invention. It is intended to limit the present invention, therefore, only by the scope of the following claims.

What we claim as new and desire to secure by Letters Patent of the United States is:

1. A method for the preparation of a transparent electrically conducting copper sulfide film in situ which comprises contacting a supported previously deposited transparent film of a reactive copper compound which is capable of reacting with a sulfur containing gas to form copper sulfide with such a sulfur containing gas for a period of time sufficient to convert at least the surface portion of the film to copper sulfide having a higher degree of transparency to light in the visible spectrum than the previously deposited transparent film.

2. A method for the preparation of a transparent electrically conducting copper sulfide film in situ which comprises depositing a transparent film of a reactive copper compound which is capable of reacting with a sulfur containing gas to form copper sulfide on a substrate, and contacting the film with such a sulfur containing gas for a period of time sufficient to convert at least the surface portion of the film to copper sulfide containing a stoichiometric excess of sulfur.

3. A method for the preparation of a transparent electrically conducting copper sulfide film in situ which comprises vapor depositing a transparent film of a reactive copper compound which is capable of reacting with a sulfur containing gas to form copper sulfide on a substrate, heating the film and contacting the heated film with such a sulfur containing gas for a period of time sufficient to convert at least the surface portion of the film to copper sulfide containing a stoichiometric excess of sulfur.

4. A method for the preparation of a transparent electrically conducting copper sulfide film which comprises vapor depositing a transparent film of a reactive copper compound which is capable of reacting with a sulfur containing gas to form copper sulfide on a substrate in a vacuum atmosphere, heating the film in a vacuum atmosphere, and contacting the heated film with such a sulfur containing gas for a period of time sufficient to convert at least the surface portion of the film to copper sulfide containing a stoichiometeric excess of sulfur.

5. A method for the preparation of a transparent electrically conducting film upon the surface of a thermoplastic layer which comprises depositing a transparent film of a reactive copper compound which is capable of reacting with a sulfur containing gas to form copper sulfide upon the surface of said layer, heating the film to temperatures below the deformation temperature of the thermoplastic layer, and contacting the heated film with such a sulfur containing gas for a sufficient period to convert at least the surface portion of the film to copper sulfide having a higher degree of transparency to light in the visible spectrum than the previously deposited transparent film and containing a stoichiometric excess of sulfur.

6. A supported transparent electrically conducting copper sulfide film containing a substantial stoichiometric excess of sulfur.

7. A composite article which comprises a transparent dielectric support and a transparent electrically conducting surface layer of copper sulfide containing a substantial stoichiometric excess of sulfur.

8. A composite article wheich comprises a transparent dielectric support, and intermediate transparent layer of a reactive copper compound which is capable of reacting with a sulfur containing gas to form copper sulfide and a transparent electrically conducting surface layer of copper sulfide containing a substantial stoichiometric excess of sulfur.

9. A composite article which comprises a flexible transparent polymeric support, an intermediate transparent layer of a reactive copper compound which is capable of reacting with a sulfur containing gas to form copper sulfide, and a transparent electrically conducting surface layer of copper sulfide containing a substantial stoichiometric excess of sulfur, said surface layer having a higher degree of transparency to light in the visible spectrum than said intermediate transparent layer.

10. In a flexible information storage medium comprising a transparent polymeric support, a transparent intermediate conducting layer, and a transparent thermoplastic recording layer, the improvement which comprises having as the conducting layer a transparent electrically conducting layer of copper sulfide containing a substantial stoichiometric excess of sulfur.

References Cited by the Examiner

UNITED STATES PATENTS

| | | | |
|---|---|---|---|
| 1,766,462 | 6/30 | Snelling | 148—6.3 |
| 1,870,425 | 8/32 | Shoemaker | 117—200 |
| 1,895,684 | 1/33 | Ruben | 117—200 |
| 1,895,686 | 1/33 | Ruben | 148—6.3 X |
| 2,867,541 | 1/59 | Coghill | 117—106 |
| 2,932,592 | 4/60 | Cameron | 117—221 |
| 3,095,324 | 6/63 | Cusano et al. | 117—215 |

RICHARD D. NEVIUS, *Primary Examiner.*